US008594344B2

(12) United States Patent
Kosinski, II et al.

(10) Patent No.: US 8,594,344 B2
(45) Date of Patent: Nov. 26, 2013

(54) METHOD AND APPARATUS FOR LAYERED AUDIO

(75) Inventors: John Thomas Kosinski, II, River Rouge, MI (US); Michael Dean Tschirhart, Ann Arbor, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 1099 days.

(21) Appl. No.: 12/564,999

(22) Filed: Sep. 23, 2009

(65) Prior Publication Data

US 2010/0098267 A1 Apr. 22, 2010

Related U.S. Application Data

(60) Provisional application No. 61/107,066, filed on Oct. 21, 2008.

(51) Int. Cl.

| | |
|---|---|
| ***H03G 7/00*** | (2006.01) |
| *H03G 3/00* | (2006.01) |
| *H02B 1/00* | (2006.01) |
| *H04W 24/00* | (2009.01) |
| *H04B 1/38* | (2006.01) |
| *G06F 17/00* | (2006.01) |

(52) U.S. Cl.
USPC ........... 381/107; 381/104; 381/123; 455/456; 455/90.1; 700/94

(58) Field of Classification Search
USPC .............. 381/107, 104, 123, 80, 86; 455/456, 455/90.1, 414.1, 345, 3.06; 700/94
See application file for complete search history.

(56) References Cited

U.S. PATENT DOCUMENTS

| | | | | |
|---|---|---|---|---|
| 5,692,058 | A * | 11/1997 | Eggers et al. | 381/107 |
| 7,305,273 | B2 | 12/2007 | Fay et al. | |
| 8,078,188 | B2 * | 12/2011 | Zivney | 381/119 |
| 2005/0281414 | A1 * | 12/2005 | Simon et al. | 381/86 |
| 2008/0226101 | A1 * | 9/2008 | Silber et al. | 381/123 |

FOREIGN PATENT DOCUMENTS

| | | |
|---|---|---|
| DE | 10242558 A1 | 4/2004 |

* cited by examiner

*Primary Examiner* — Vivian Chin
*Assistant Examiner* — Ammar Hamid
(74) *Attorney, Agent, or Firm* — Dickinson Wright PLLC

(57) ABSTRACT

A system and method for providing layered audio which allows a user to selectively and simultaneously listen to multiple audio sources for limited time periods and switch between these layered audio sources. The system allows a user to discernibly listen to two content sources at the same time.

17 Claims, 1 Drawing Sheet

METHOD AND APPARATUS FOR LAYERED AUDIO

CROSS REFERENCE TO RELATED APPLICATION

This application claims the benefit of U.S. Provisional Patent Application Ser. No. 61/107,066 filed Oct. 21, 2008 entitled "Method And Apparatus For Layered Audio," the entire disclosure of the provisional application being considered part of the disclosure of this application and hereby incorporated by reference.

BACKGROUND OF THE INVENTION

1. Field of the Invention

The present invention is directed to a method and apparatus for selectively listening to multiple audio sources for limited time periods and switching between the simultaneous output audio sources.

2. Discussion

Modern consumers have numerous sources of content available for entertainment. In particular, consumers when in vehicles typically have numerous audio content sources available through the entertainment system or "radio" of the vehicle. These content sources include various traditional audio sources, such as AM/FM radio bands, tapes, CD's and CD changers, as well as more recently satellite radio, MP3 files and other mass storage devices with audio content. With such a wide variety of audio content available, many users quickly switch audio content sources to avoid temporary undesirable audio content whether a song, commercial or other content that the user does not wish to hear. However, when the user switches to a secondary content, it is currently not possibly to know when the original undesirable content from the original source is finished, such that the user can switch back in a timely fashion. While one way to solve the problem of undesirable content would be for the audio source, such as a radio station to provide a signal between content to delineate between different songs or the scheduled programming and commercials, this is generally not in the interest of a radio station and would be unlikely to be implemented.

Many radio listeners have primary or favorite stations. These stations will, from time-to-time, broadcast a song, commercial, discuss an uninteresting or undesirable topic, or broadcast any other content which the user does not wish to hear. Traditionally, the user would switch to other content sources such as another radio station or a mass storage device to avoid the undesirable content. Many times the user desires to hear the upcoming content once the undesirable content is finished and the user has no way of determining when that undesirable content is finished. Therefore, the user does not know when to return to the original content source and many times misses portions of desirable content. As a more specific example, many users listen to talk shows during their commute in a vehicle. When a commercial break occurs, many users switch to another content source, such as a CD or another radio station. As the user finds the original content was interesting, typically the user is desirous to switch back to the original audio source upon the end of the undesirable content. However, the user has no idea when such content ends and many times misses a portion of the desirable content or returns to the original source too early and is forced to finish listening to the end of the undesirable content before the desired content returns.

Therefore, there is a need for a system and method that easily allows for a user to determine when to switch back to the desired content and preferably without any input from the broadcaster.

SUMMARY OF THE INVENTION AND ADVANTAGES

The present invention is directed to a method and apparatus for selectively listening to multiple audio sources through layered audio.

The system uses a method of layered audio where one temporary or secondary audio source substantially replaces the primary or original audio source. In general, layered audio refers to simultaneously presented audio from distinct sources. More specifically, upon selection of layered audio, the original audio source is played in a muted fashion in the background, such that the original source is played in a less prominent fashion and the temporary or secondary audio source is layered over the original audio source in a more prominent fashion. This allows a user to enjoy audio content from an alternative source while still being able to determine when to return to the original source, or even whether to abandon the original source, if the original content source does not return to desirable content, and listen to the new content source or some other content source.

Further scope of applicability of the present invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

Other advantages of the present invention will be readily appreciated and more fully understood by reference to the following detailed description when considered in connection with the accompanying drawing wherein.

DETAILED DESCRIPTION OF THE INVENTION

The present invention may be included in or configured for any system having multiple audio sources available for selection. The system may be provided as part of the original entertainment system having multiple audio content sources or added after-market to a system. It is particularly useful to vehicle and mobile entertainment systems. The system generally may use any known configuration and capabilities, but must have at least two available content or audio sources, selectable by the user, and must have the ability to layer or simultaneously present the audio content from the secondary source in addition to the primary source such that the user may minimally hear the one source, such as the primary source, while also hearing a secondary source with prominence and wherein the secondary source may have primary interaction with the user. The system must also provide the functionality for the user to select or deselect the layered audio; however, this functionality and ability should be easily programmed into known systems especially those with programmable keys or buttons.

The user may also select the characteristics used to layer the audio or content sources. A variety of techniques may be used to layer the audio sources. One of the simplest techniques would be that the system, upon a command from a user, would minimize the output of the primary source and then upon selection of a secondary source by a user, increase the output of the secondary source relative to the minimized primary output. However, other techniques may be made to minimize the interaction of the user with the primary source or the audibility of the primary source while increasing the interaction of the user with the secondary source or audibility of the secondary source. For example, the primary source may be reduced to lower equalization frequencies, while the secondary source focuses higher equalization frequencies. This will allow enhanced separatability of the audio system as it allows for greater ability of users to distinguish between the audio signals. Of course, this equalization technique may be combined with a minimizing of the audio level of one source while outputting at a greater audio level than the primary source, a secondary source. Other processing features may also be used to further separate the sources, such as separating certain frequencies (or sources) to certain channels or speakers within a vehicle.

Figure 1:
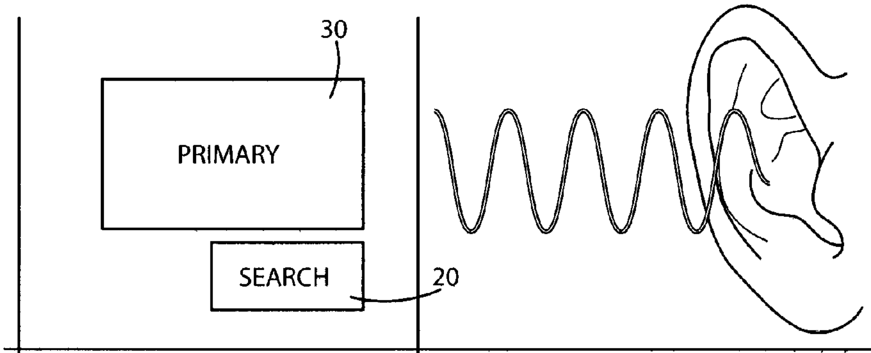
FIG. 1 is a schematic illustration of an active primary station showing a single audible primary audio source.
Figure 2:
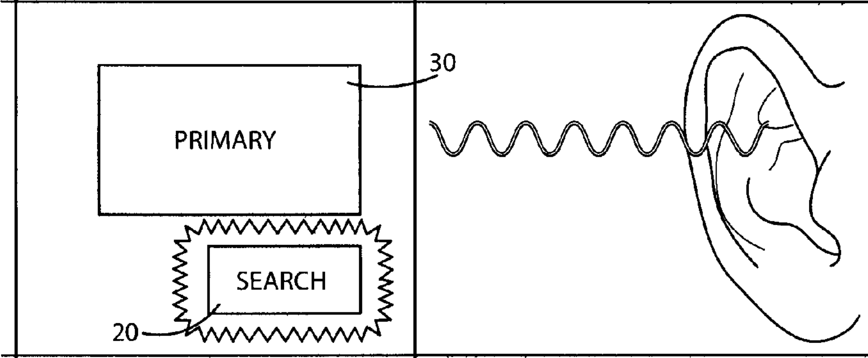
FIG. 2 is a schematic illustration of a minimized primary station while the user searches for new content showing a minimized audible primary audio source.

The system as illustrated in FIGS. 1-4 illustrates a simple method to switch to the layered audio mode such as the illustrated soft key button 20 in FIG. 1. As an example of layered audio, if the primary source is a radio station and the user desires to temporarily navigate away from the primary audio source for a temporary time period and wishes to know when to return to the primary audio source, the user enters layered audio mode and selects a secondary source to be layered audio with the primary source. The exemplary of secondary source may be a different radio station or channel or a CD track. It is also advantageous for the user to be able to select different audio sources for the layered second source (not illustrated), as well as different content within that audio source. More specifically, while the selection of the secondary audio source may bring the user to an already desirous radio station, it is also desirable to allow the user to navigate within the selected secondary audio source, in this example the FM band for other FM radio stations. Navigation within the secondary source may be simply skipping between CD tracks or changing radio stations. For example, this navigation would allow a user to seek for a desired radio station such as through the preset buttons on the vehicle entertainment system (not illustrated) or to use the seek or scan buttons to change the radio stations. More specifically, in the preferred embodiment when the user switches to the secondary mode or layered mode, all functionally operating buttons of the vehicle entertainment system such as seek, scan, preset buttons, skip tracks, and other functions are active and usable by the secondary audio source or the layered audio source. Therefore, the only difference in operation in layered mode is that the original or primary source continues to play in a muted fashion in the background such as at a lower sound level while the primary audio source plays louder than the secondary source and the system allows for full functionality of the radio as applied to the secondary audio source. More specifically, the user then has full ability to manipulate the secondary audio source when it is active. In some embodiments, it may be helpful for the user to have the ability to increase the differentiation between the audio sources. For example, the user may increasingly minimize the primary source while relatively increasing the secondary source, such that the user hears less of the primary source and more of the secondary or temporary source. To enter layered audio mode, the user may select this function by pressing a button (not illustrated) or the system may be programmed to automatically enter layered audio mode upon pushing a search or seek button, is illustrated in FIG. 2.

Figure 3:
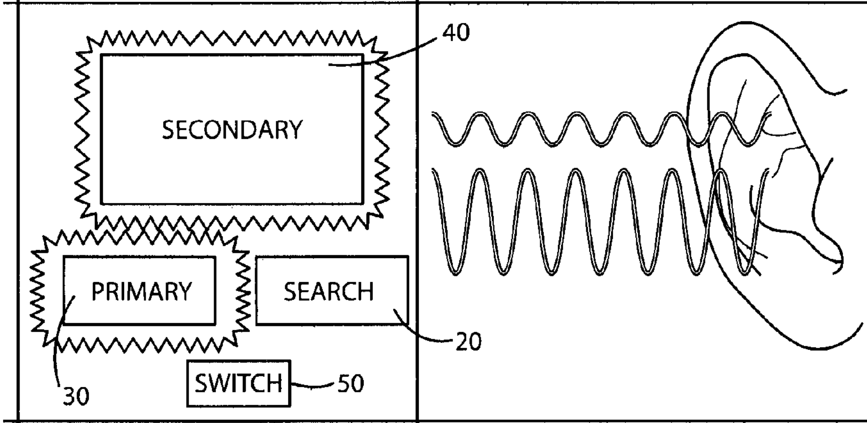
FIG. 3 is a schematic illustration of a secondary audio source being maximized, while the original primary source is minimized and showing the layered audio outputs with the smaller amplitude waves signifying the minimized audible primary audio source and the large amplitude waves signifying a maximized secondary source.
Figure 4:
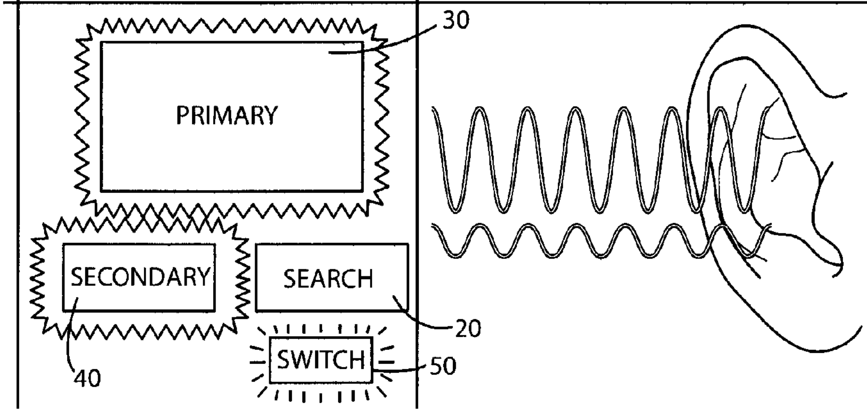
FIG. 4 is a schematic illustration of the sources active in FIG. 3 being switched in response to a switch command.

In some embodiments, it may be preferable for the system to be able with a single touch to either swap the primary and secondary sources once layered audio was selected, such that the volume levels are swapped while maintaining both sources in layered mode, such as the switch key 50 illustrated in FIG. 4 which illustrates the switch of sources from FIG. 3. This is advantageous to a user who likes both programs and switches between the two programs for perceived highlights. It would also be convenient for the user if the system allowed for selection of a secondary source as the primary source and at the same time kills the audio from the original primary audio source such that the original secondary audio source is the only active output from the vehicle entertainment system, if for example, pushing a soft key signifying the desired source, such as soft keys 30 and 40. Once the original audio source is removed, the now active source becomes the new primary or original source. This allows the user with one button pushed to eliminate the original or primary audio source which is playing in the background. For example, a second push or activation of an appropriate control or button will make the secondary source the new primary source and stop broadcasting audio from the original primary audio source, which was the background source. The same type of function may be used to kill the secondary source such that the system reverts back to only providing the primary source.

To create a layered audio output from the vehicle entertainment system or radio, the easiest method is for the system to reduce the volume on the primary or original audio source and then add in audio at a higher volume from a secondary or temporary audio source. Of course, it may be preferable for a user to be able to adjust the volume differential to their own preferences. The user may adjust or the system may have a preset minimum volume level of the background audio such as the original or primary audio source. The volume differential may not be a constant value but may vary depending upon the overall volume of the system and upon the volume of the secondary source. For example, as the user increases the volume for the secondary audio source, to maintain the ability for the user to hear the background channel or audio source, the system may increase the audio output of the background or primary audio source proportionally. Also for example, at quieter levels of volume for the secondary source, the volume level of the primary or original audio source as a percentage level may be required to be higher than when the volume of the secondary source is much higher volume such that the user may hear the background or primary audio source over the layered and secondary audio.

For systems with more than one speaker such as in vehicles for other entertainment systems, additional methods are available for providing layered audio. For example, in a vehicle with multiple speakers, the rear speakers may play one of the primary and secondary sources while the front plays the other of the primary and secondary sources. Of course, it is likely that the volume for the speakers playing the primary source will need to be reduced while the system is in layered audio mode. Other methods of layered audio for vehicles may include reduced volume on one of the front driver's side speaker(s) or the remaining speakers as a primary audio source and outputting the secondary audio source at sufficient volume on the other of the front driver's side speaker(s) or remaining speakers. Yet another method is to switch the passenger front speaker for the driver side speaker as described in the above example.

The system should be configured for easy exit of layered audio mode. The system may exit after a certain amount of time such as five minutes or other time periods set by the user or the system may exit upon a push of a button by the user on the vehicle entertainment system. Of course, this all may be customized by the user.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. An entertainment system comprising:

a first audio input;

a second audio input;

an interface; and an audio output and wherein the system is capable of combining audio content from the first and second audio contents and audibly outputting said audio content from the first and second audio inputs through said audio output and wherein the audio content of said second audio input is audibly greater than the audio content of said first audio content, wherein:

said interface includes a first button and wherein upon an initial signal from said first button the system adds the audio content from said second audio input to the audio output, said first and second audio inputs each include the ability to select a plurality of audio content within the audio inputs and wherein the interface includes at least one button for selecting audio content within said first and second audio inputs, said at least one button for selecting audio content controls the first audio input when the first audio input is the only audible output from said audio output, and the at least one button controls the first audio input by allowing a user of the system to navigate between CD tracks or to navigate between radio stations.

2. The entertainment system of claim 1 wherein said at least one button for selecting audio content controls the second audio input when said second audio input is added and is audibly greater than the audio content of the first audio content.

3. The entertainment system of claim 1 wherein the system upon a signal from said interface while both of said first and second audio contents are being output, the system switches the dominate audio content from the second audio content to the first audio content wherein the first audio content is audibly louder than the second audio content.

4. The entertainment system of claim 3 wherein said signal from the interface is from a switch button.

5. The entertainment system of claim 1 wherein the system reduces the volume level of the first audio input when the second audio input is added to the audio output.

6. The entertainment system of claim 1 wherein one of said first and second audio inputs is reduced to a lower equalization frequency while the other of said first and second audio inputs is increased to a higher equalization frequency.

7. The entertainment system of claim 1 wherein each of said first and second audio inputs are selected from one of said group consisting of radio frequencies, satellite radio channels, CD tracks, CDs, and content from mass storage devices.

8. A method of layering audio in a vehicle entertainment system comprising the steps of:

receiving a first audio input;

receiving a second audio input;

layering said first audio input with said second audio input upon receiving an input from an interface;

adjusting the audio output of the first input from the second audio input to distinguish the two audio inputs and wherein the second audio input is the dominant audio output, wherein:

said interface includes a first button and wherein upon an initial signal from said first button the system adds the audio content from said second audio input to the audio output, said first and second audio inputs each include the ability to select a plurality of audio content within the audio inputs and wherein the interface includes at least one button for selecting audio content within said first and second audio inputs, said at least one button for selecting audio content controls the first audio input when the first audio input is the only audible output from said audio output, and the at least one button controls the first audio input by allowing a user of the system to navigated between CD tracks or to navigate between radio stations.

9. The method of claim 8 wherein said step of adjusting the audio output includes the steps of increasing the audio volume of the second audio input and decreasing the audio volume of the first audio input.

10. The method of claim 8 wherein said step of adjusting the audio output includes the steps of adjusting the first audio input to one of a lower equalization frequency and a higher equalization frequency and adjusting the second audio output to one of a lower equalization frequency and a higher equalization frequency.

11. The method of claim 8 further including the step of switching the first and second audio inputs such that the first input is the dominant audio output upon receiving a signal from the interface.

12. The method of claim 9 further including the step of selecting individual audio content from the dominant audio content of the first and second audio inputs.

13. The method of claim 8 further including the step of selecting only a single audio input for audio output upon receiving a signal from the interface.

14. The entertainment system of claim 6 wherein an increase amount is contingent on a reduction amount.

15. The method of claim 9 wherein an amount of the increase to the volume is contingent on an amount of decrease to the volume.

16. The entertainment system of claim 1 wherein the system exits a state of combination of the audio content after a pre-determined time.

17. The entertainment system of claim 8 further comprising exiting a state of combination of the audio content after a pre-determined time.

* * * * *